United States Patent
Yang et al.

(10) Patent No.: US 7,196,408 B2
(45) Date of Patent: Mar. 27, 2007

(54) FAN OUT TYPE WAFER LEVEL PACKAGE STRUCTURE AND METHOD OF THE SAME

(75) Inventors: Wen-Kun Yang, No. 47, Lane 6, Ankang St., Hsinchu (TW) 300; Wen-Pin Yang, Hsinchu (TW); Shih-Li Chen, Jhudong Township, Hsinchu County (TW)

(73) Assignee: Wen-Kun Yang, Hsinchu (TW)

( * ) Notice: Subject to any disclaimer, the term of this patent is extended or adjusted under 35 U.S.C. 154(b) by 0 days.

(21) Appl. No.: 11/301,303

(22) Filed: Dec. 12, 2005

(65) Prior Publication Data

US 2006/0091514 A1     May 4, 2006

Related U.S. Application Data

(62) Division of application No. 10/725,933, filed on Dec. 3, 2003.

(51) Int. Cl.
*H01L 23/02*     (2006.01)

(52) U.S. Cl. .............. 257/686; 257/E23.169; 257/E23.173

(58) Field of Classification Search ............ 257/686; 438/109
See application file for complete search history.

(56) References Cited

U.S. PATENT DOCUMENTS

| | | | |
|---|---|---|---|
| 5,239,198 A | 8/1993 | Lin et al. | 257/693 |
| 5,323,051 A | 6/1994 | Adams et al. | 257/417 |
| 5,353,498 A * | 10/1994 | Fillion et al. | 29/840 |
| 5,629,835 A | 5/1997 | Mahulikar et al. | 361/719 |
| 5,745,984 A | 5/1998 | Cole et al. | 29/834 |
| 5,841,193 A | 11/1998 | Eichelberger | 257/723 |
| 6,680,529 B2 * | 1/2004 | Chen et al. | 257/700 |
| 6,836,025 B2 * | 12/2004 | Fujisawa et al. | 257/782 |
| 6,908,785 B2 * | 6/2005 | Kim | 438/106 |
| 6,960,826 B2 * | 11/2005 | Ho et al. | 257/723 |
| 7,045,391 B2 * | 5/2006 | Lin | 438/109 |
| 2003/0122243 A1 | 7/2003 | Lee et al. | 257/700 |

FOREIGN PATENT DOCUMENTS

| | | |
|---|---|---|
| TW | 177766 | 5/2003 |
| TW | 543125 | 7/2003 |

* cited by examiner

*Primary Examiner*—David A. Zarneke
(74) *Attorney, Agent, or Firm*—Kusner & Jaffe

(57) ABSTRACT

To pick and place standard dies on a new base for obtaining an appropriate and wider distance between dies than the original distance of dies on a wafer. The package structure has a larger size of balls array than the size of the die by fan out type package. Moreover, the die may be packaged with passive components or other dies with a side by side structure or a stacking structure.

6 Claims, 6 Drawing Sheets

FAN OUT TYPE WAFER LEVEL PACKAGE STRUCTURE AND METHOD OF THE SAME

RELATED APPLICATIONS

This application is a divisional of U.S. application Ser. No. 10/725,933, filed Dec. 3, 2003.

FIELD OF THE INVENTION

This invention relates to a package for semiconductors, and more particularly to a fan out type wafer level package.

DESCRIPTION OF THE PRIOR ART

The semiconductor technologies are developing very fast, and especially semiconductor dies have a tendency toward miniaturization. However, the requirements for the functions of the semiconductor dies have an opposite tendency to variety. Namely, the semiconductor dies must have more I/O pads into a smaller area, so the density of the pins is raised quickly. It causes the packaging for the semiconductor dies to become more difficult and decrease the yield.

The main purpose of the package structure is to protect the dies from outside damages. Furthermore, the heat generated by the dies must be diffused efficiently through the package structure to ensure the operation the dies.

The earlier lead frame package technology is already not suitable for the advanced semiconductor dies due to the density of the pins thereof is too high. Hence, a new package technology of BGA (Ball Grid Array) has been developed to satisfy the packaging requirement for the advanced semiconductor dies. The BGA package has an advantage of that the spherical pins has a shorter pitch than that of the lead frame package and the pins is hard to damage and deform. In addition, the shorter signal transmitting distance benefits to raise the operating frequency to conform to the requirement of faster efficiency. For example, the U.S. Pat. No. 5,629,835 discloses a BGA package, by Mahulikar et al; the U.S. Pat. No. 5,239,198 discloses another package that the FR4 substrates having a pattern of conductive traces thereon are mounted on a PCB; the Taiwan Patent No. 177,766 (Taiwan Published Patent Document No. 531,854) discloses a fan out type WLP and the method of the same, by the inventor of the present invention.

Most of the package technologies divide dies on a wafer into respective dies and then to package and test the die respectively. Another package technology, called "Wafer Level Package (WLP)", can package the dies on a wafer before dividing the dies into respective dies. The WLP technology has some advantages, such as a shorter producing cycle time, lower cost, and no need to under-fill or molding. The U.S. Pat. No. 5,323,051, "Semiconductor wafer level package", is disclosed a WLP technology by Adams et al. The technology is described as follow. As shown in FIG. 1, a die 4 is formed on a surface of a semiconductor wafer 2, and a cap wafer 6 with a predetermined pattern of frit glass walls 8 as a bonding agent is deposited on a surface of the semiconductor wafer 2, such that the die 4 is completely surrounded by the frit glass walls 8. Then, a surface of the semiconductor wafer 2 without the die 4 is polished to reduce the height of the semiconductor wafer 2; the process is generally called "Back Grinding". The die 4 is hermetically sealed in a cavity of predetermined dimensions formed by a combination of the semiconductor wafer 2, the cap wafer 6, and the frit glass walls 8. A plurality of metal traces 10 forms a plurality of electrodes on semiconductor substrate wafer 2 which provide electrical coupling to die 4. A plurality of wires 12 is bonded to a plurality of pads formed on exterior portions of metal traces 10, and extends through hole 14 and is coupled to external electrical dies (not shown).

As aforementioned, the size of the die is very small, and the I/O pads are formed on a surface of a die in the conventional arts. Therefore, number of the pads is limited and a too short pitch among pads results in a problem of signal coupling or signal interface. The solder is also to form a solder bridge easily due to the too short pitch among pads. Moreover, the size of die gradually become smaller and the packaged IC of the die does not have standard size by some package technologies (such as chip size package), but test equipment, package equipment, etc. for some fixed sizes die or packages can not be kept on using.

SUMMARY OF THE INVENTION

Therefore, the present invention has been made in view of the above problems in the prior arts, and it is an objective of the present invention to provide a fan out type wafer level package structure and a method for manufacturing the same.

Another objective of the present invention is to provide a fan out type wafer level package structure to maintain an appropriate pitch between two adjacent pads of the package structure.

Still another objective of the present invention is to avoid problems of signal coupling and signal interface.

Another objective of the present invention is to lower the cost of the package structure.

Still another objective of the present invention is to raise the yield of the package structure.

Another objective of the present invention is to provide package structure with a adjustable size to keep on using of test equipment, package equipment, etc. having for some fixed sizes die or packages.

As aforementioned, the present invention provides a process of fan out type wafer level package. First, a plurality of dies is adhered to an isolating base. A first material layer is formed on the isolating base, wherein a space among the plurality of dies on the isolating base is filled up with the first material layer, and surfaces of the first material layer and the plurality of dies are at same level. Then, the first material layer is cured. A second material layer is formed on the first material layer and the plurality of dies. A partial region of the second material layer on pads of the plurality of dies is etched to form first openings. Next, the second material layer is cured. Contact conductive layer are formed on the first openings to electrically coupling with the pads, respectively. A photo resist layer is formed on the second material layer and the contact conductive layer. A partial region of the photo resist layer is removed to form a fan out pattern and expose the contact conductive layer. After that, conductive lines are formed on the fan out pattern and the conductive lines are coupled with the contact conductive layer, respectively. The remaining photo resist layer is removed. Following that, an isolation layer is formed on the conductive lines and the second material layer. A partial region of the isolation layer on the conductive lines is removed to forming second openings. The isolation layer is cured. Finally, solder balls are welded on the second openings and the base is sawed to isolate the plurality of dies.

The present invention also provides a fan out type package structure. The package structure comprises an isolating base, a die, a first dielectric layer, a second dielectric layer, a contact conductive layer, conductive lines, an isolation layer, and solder balls. The die is adhered to the isolating base. The first dielectric layer is formed on the isolating base and filled in a space except the die on the isolating base, wherein surfaces of the first dielectric layer and the die are at same level. The second dielectric layer is formed on the first dielectric layer and the die, and the second dielectric layer has first openings on pads of the die. The contact conductive layer is formed on the first openings to electrically coupling with the pads, respectively. The conductive lines are formed on the second dielectric layer and corresponding the contact conductive layer, and the conductive lines are extended out from corresponding the contact conductive layer to corresponding end points, wherein the corresponding end points are inside a surface of the second dielectric layer. The isolation layer is formed on the conductive lines and the second dielectric layer, and the isolation layer has second openings on the conductive lines. The solder balls are welded on the second openings and electrical coupling with the conductive lines, respectively.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

The essence of the present invention is to pick and place standard dies on a new base for obtaining an appropriate and wider distance between dies than the original distance of dies on a wafer. Therefore, the package structure has a larger size of balls array than the size of the die to avoid the problem of having too close ball pitch. Moreover, the die may be packaged with passive components (ex. capacitors) or other dies with a side by side structure or a stacking structure. The detailed process of the present invention will be described below.

A processed silicon wafer with dies is put on a tray and then the thickness of the processed silicon wafer is decreased by back lapping to get a thickness range of 50–300 µm. The processed silicon wafer with the aforementioned thickness is easily sawed to divide the dies on the wafer into respective dies. The back lapping step may be omitted if the processed silicon wafer is not hard to saw without back lapping. A dielectric layer (protection layer) is optionally formed on the processed silicon wafer before sawing to protect dies form damages.

Figure 1:
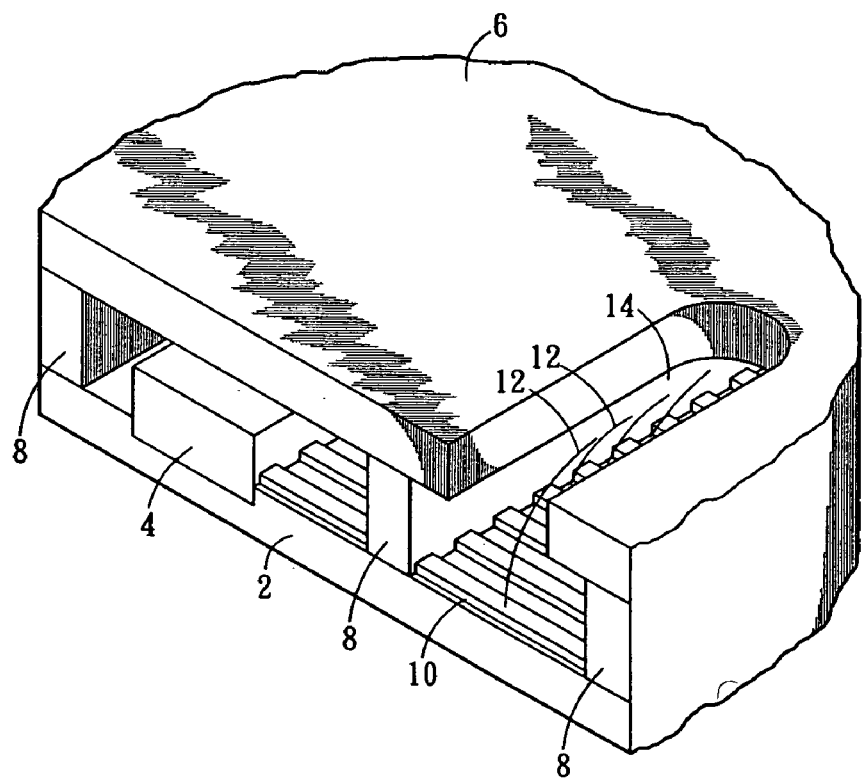
FIG. 1 is a schematic diagram of a semiconductor wafer level package in the conventional arts.
Figure 2A:
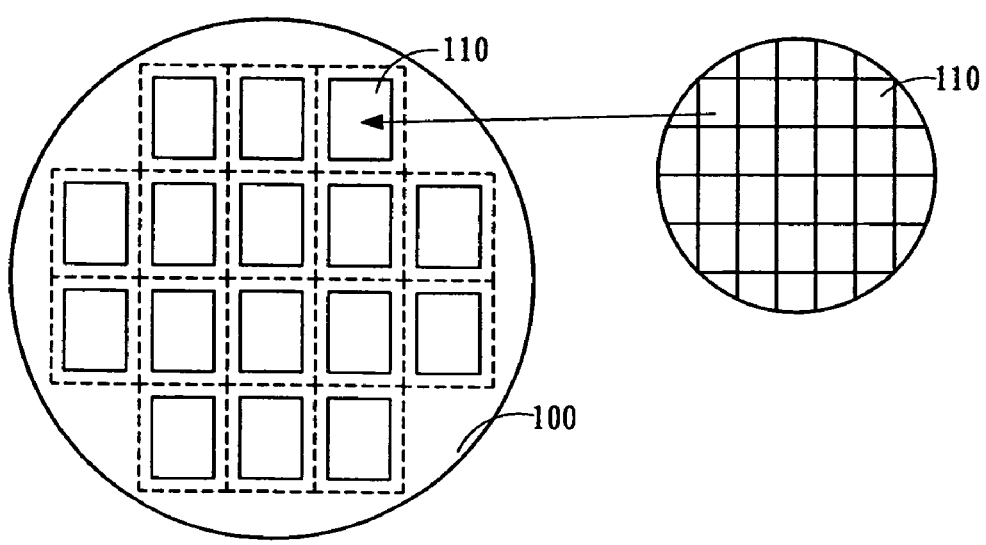
FIG. 2A to FIG. 2C are schematic diagrams of using pick & place to replace standard dies onto a new base.
Figure 2B:
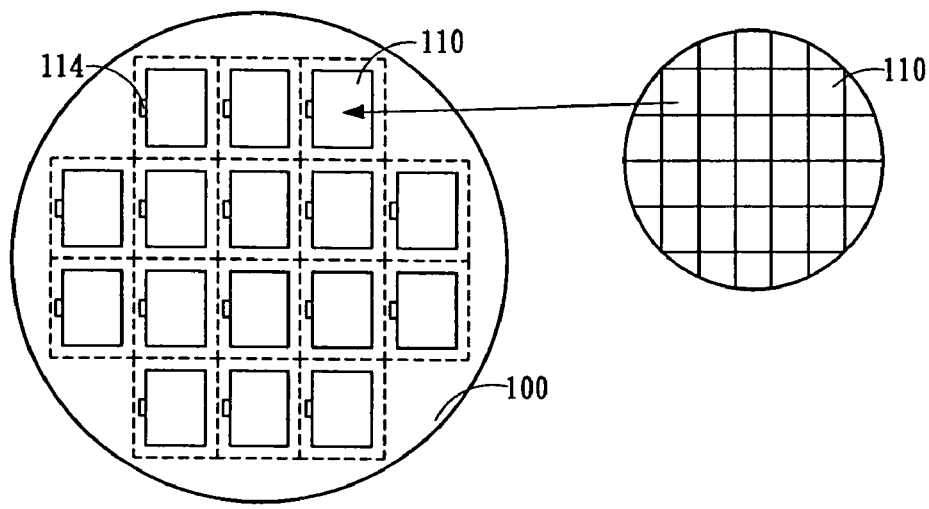
Figure 2C:
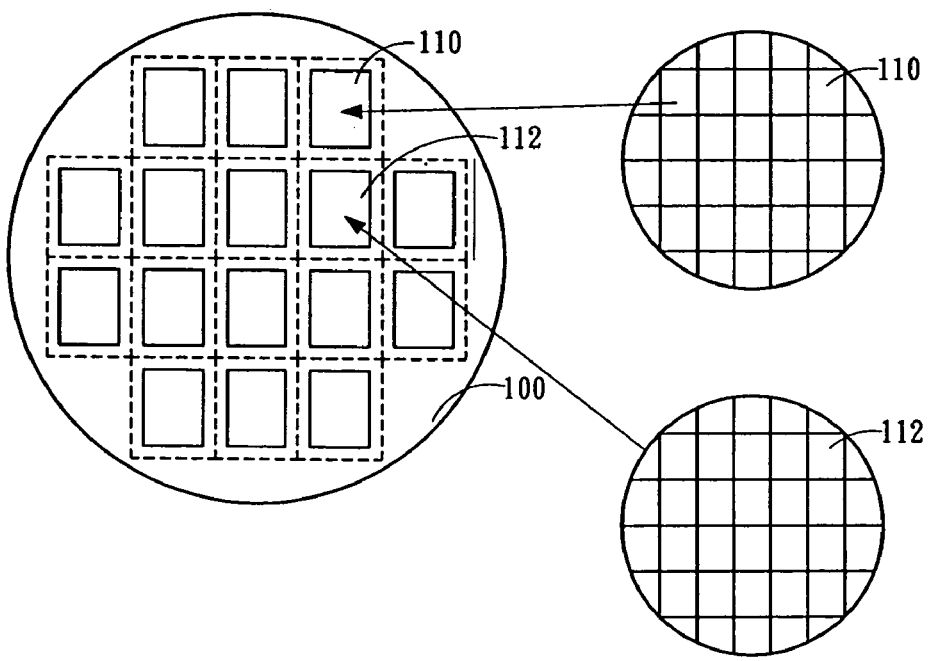
Figure 3:
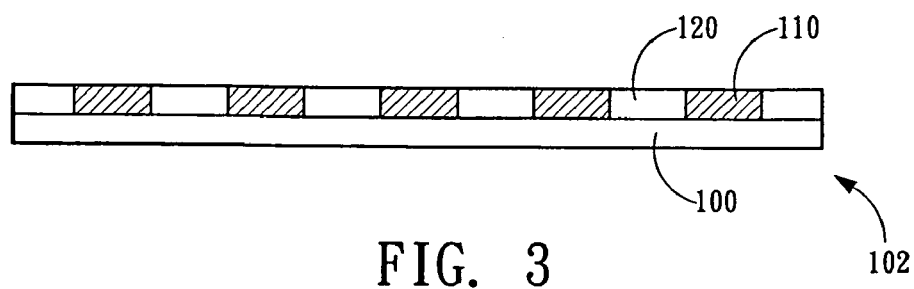
FIG. 3 is a schematic diagram of forming a first material layer on the base.
Figure 4:
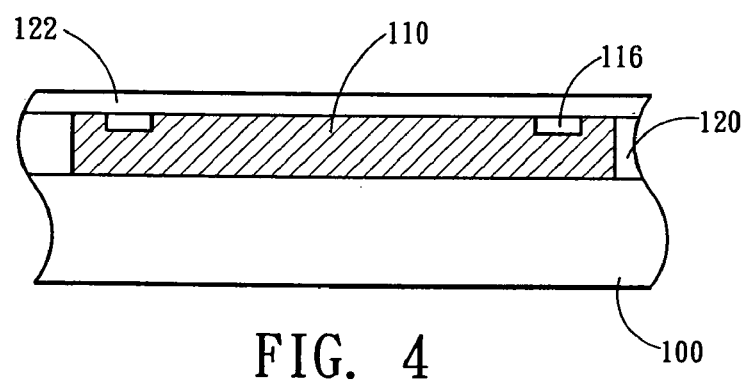
FIG. 4 is a schematic diagram of forming a second material layer on the first material layer and the die.
Figure 5:
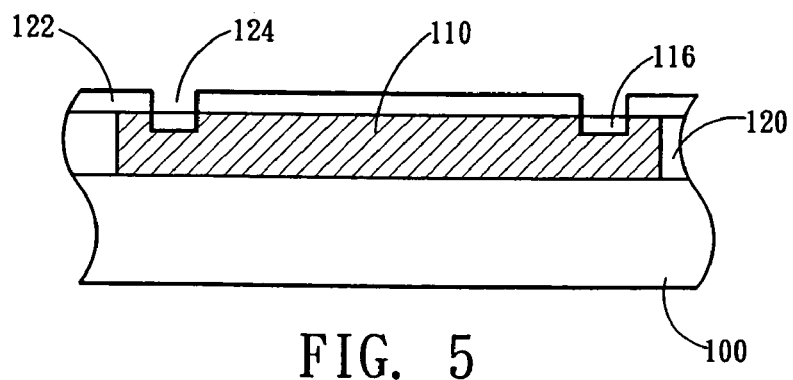
FIG. 5 is a schematic diagram of etching a partial region of the second material layer on pads of the die to form first openings.

The divided dies are tested to choose standard good dies 110 there from. The standard good dies 110 are picked and replaced onto a new base 100 with a wider distance between two adjacent dies and adhered to the base 100 with an UV curing type and/or heat curing type adhesion material with good thermal conductivity (not shown), as shown in FIG. 2A. The adhesion material is coating on the base 100, and the thickness of the adhesion material is preferably 20–60 µm. When the dies 110 are placed on the adhesion material, the adhesion material is cured by UV light or thermal. The distance between two adjacent dies on the base 100 is arranged wider to have enough space for forming fan out ball array in later steps. Hence, the present invention can maintain an ideal ball pitch for avoiding problems of signal coupling and signal interface and increase the number of I/O ports (balls), even the size of dies becomes smaller. The dies 110 have I/O pads 116 on the upper surface (as shown in FIG. 4). Passive components 114 or dies 112 are also placed on an adjacent place of the base 100 to obtain a filtering or other functions, as shown in FIG. 2B and FIG. 2C. The material of the base 100 can be glass, silicon, ceramic, crystal materials, etc. and even have a round or a rectangular shape. In the present invention, the number of dies and passive components packaged together are not limited. More than three dies and passive components also can be packaged in the same package structure by the present invention. The adhesive material of the present invention is preferably good thermal conductive material, so the problems (such as stress) resulted from the temperature difference between the dies 110 and the base 100 can be avoided.

The illustration and the corresponding figure below are made through single die to simplify and provide a more clear description comprehension of the present invention.

First material layer 120 is formed to fill in the space among the die 110 and adjacent dies 110, and the surface of the first material layer 120 and the surface of the die 110 are at same level. The material of the first material layer 120 can be UV curing type or heating curing type material. Then, the first material layer 120 is cured by UV or thermal. The first material layer 120 may be formed by a screen printing method or a photolithography method. The first material layer 120 functions as a buffer layer to reduce a stress due to temperature, etc. The first material layer 120 can be a UV and/or heat curing material, such as silicon rubber, epoxy, resin, BCB, and so on. The aforementioned structure 102, comprising the base 100, the dies 110, and the first material layer 120, looks same as a wafer with the dies 110 facing above.

As shown in FIG. 4, a second material layer 122 is coated on the structure 102. The material of the second material layer 120 can be UV curing type or heating curing type material, such as BCB, epoxy, SINR3170 (produced by Shin-Etsu Chemical Co., Ltd.), and so on. Then, the partial area of the second material layer 122 on the pads 116 of the die 110 is removed by using a photo mask to form first openings 124 on the pads 116, and then the second material layer 120 is cured by UV or heating. Next, the plasma etching (RIE) can be used optionally to clean the surface of the pads 116 to make sure no residual materials on the pads 116.

Figure 6:
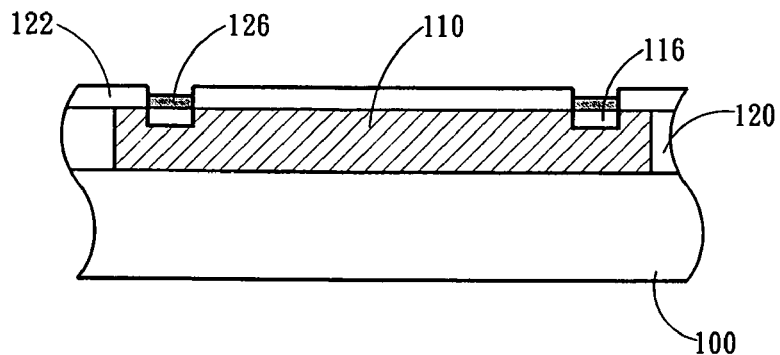
FIG. 6 is a schematic diagram of forming contact conductive layer on the first openings.
Figure 7:
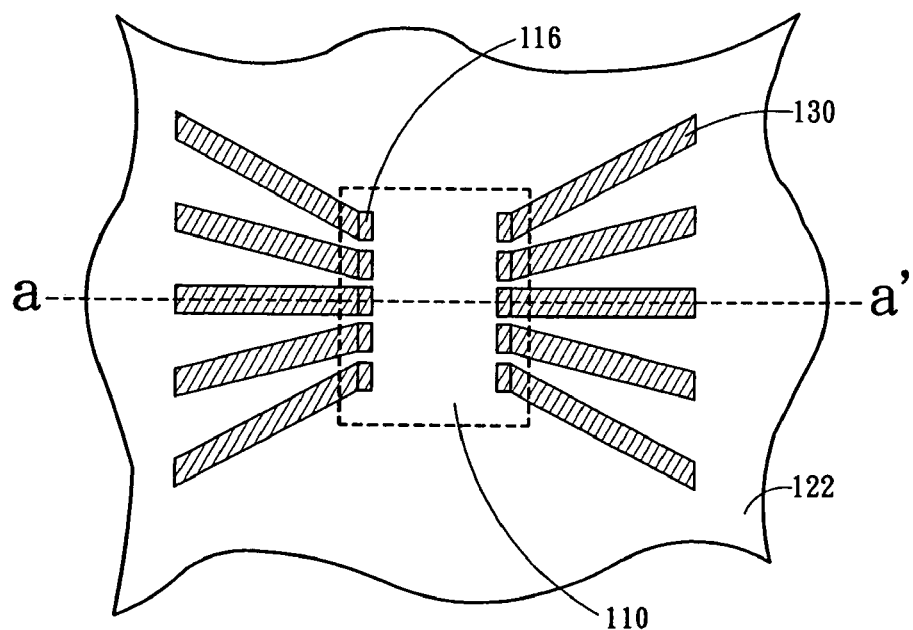
FIG. 7 is a schematic vertical view diagram of forming conductive lines on fan out pattern formed by a photo resist layer.
Figure 8:
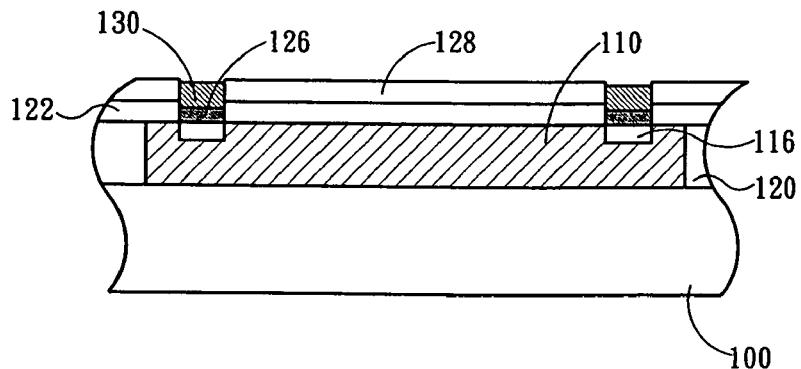
FIG. 8 is a schematic lateral view diagram of forming conductive lines on fan out pattern formed by a photo resist layer along a–a' in FIG. 7.

The contact conductive layer 126 is formed on the pads 116, as shown in FIG. 6. The preferable material of the contact conductive layer 126 is Ti, Cu, or the combination thereof. The contact conductive layer 126 can be formed by a physical method, a chemical method, or the combination thereof, for example: CVD, PVD, sputter, and electroplating. A photo resist layer 128 is formed on the second material layer 122 and the contact conductive layer 126, and then a fan out pattern of the photo resist layer 128 is developed by using a photo mask. The fan out pattern has a plurality of fan out openings starting form the pads 116 to end points inside a surface of the second dielectric layer 122, respectively. Namely, the end points of two adjacent fan out openings can have wider pitches there between than the pitch between two adjacent pads 116. Then, conductive lines 130 by electro plating are formed on the contact conductive layer 126, as shown in FIG. 7 (vertical view) and FIG. 8 (lateral view, along a–a' in FIG. 7). The material of the conductive lines 130 are preferably Cu, Ni, Au, or the combination thereof.

Figure 9:
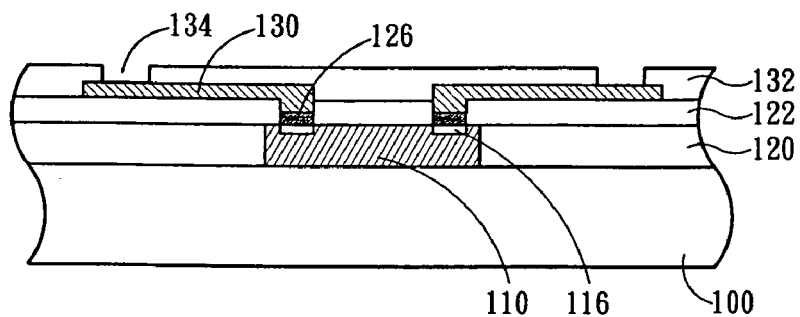
FIG. 9 is a schematic diagram of forming an isolation layer on the conductive lines and the second material layer.

Referring to FIG. 9, the photo resist layer 128 and the contact conductive layer 126 are etched, and then an isolation layer 132 is formed on the conductive lines 130 and the second material layer 122, and the second openings 134 are formed on the conductive lines 130 by using a photo mask. Next, the first isolation layer 132 is cured. The first isolation layer 132 may be formed by spin coating or screen printing. The positions of the second openings 134 may be formed above the die 110 or the first material layer 120, preferably formed close to the ending points of the conductive lines 130 respectively, so a suitable distance between two adjacent second openings 134 is to form solder balls 136 on second openings 134 without the problem of signal coupling and signal interface.

Figure 10:
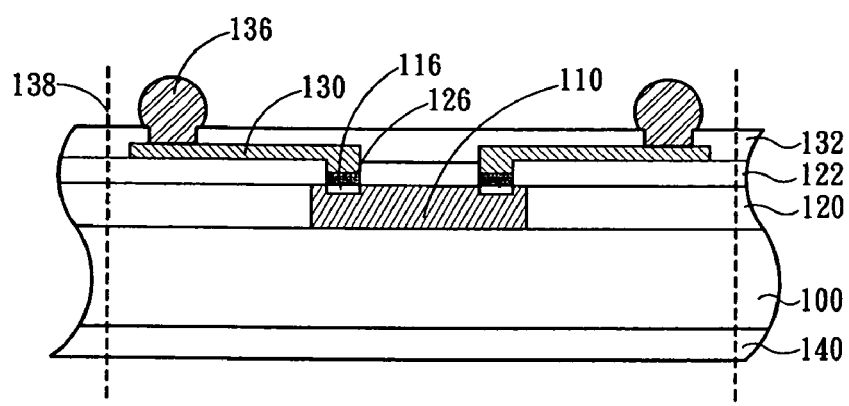
FIG. 10 is a schematic diagram of one packaged structure according to the present invention.

Referring to FIG. 10, an epoxy layer 140 is formed on the back side of the base 100, i.e. on the surface of the base 100 having no die 110 formed thereon. Then, a top mark is formed on the epoxy layer 140 by using a photo mask and the epoxy layer 140 is cured. Or using the ink printing with stencil then heat/UV curing to form a top mark. The top mark is for identified the device name. The step of forming the epoxy layer 140 may be omitted. Next, the solder balls 136 are placed onto the solder openings 134 and joined the solder balls 136 and the surface of the conductive lines 130 with IR re-flow.

Figure 11:
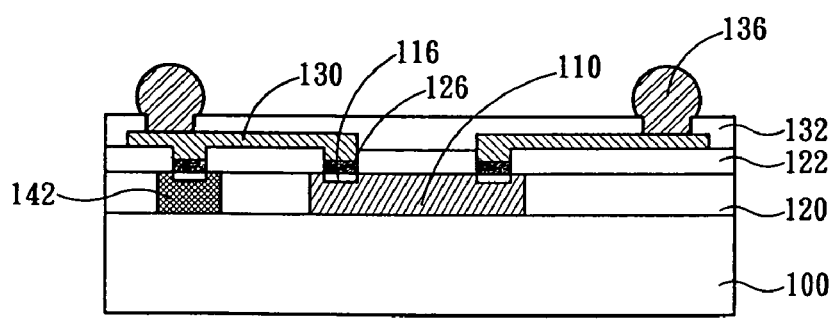
FIG. 11 is a schematic diagram of one packaged structure having a die and a passive component according to the present invention.
Figure 12:
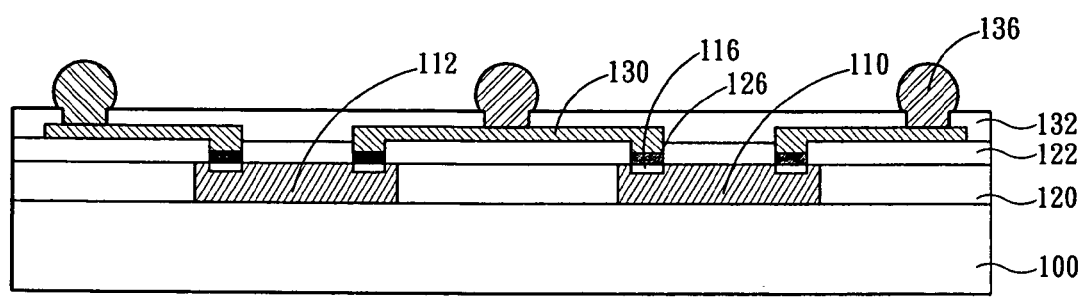
FIG. 12 is a schematic diagram of one packaged structure having two dies according to the present invention.

Final, the packaged base 100 with the aforementioned structure is sawed along the sawing line 138 to isolate respective packaged IC. As aforementioned, the packaged IC may be included passive component 142 and the die 110, as shown in FIG. 11. The packaged IC also may be a multi dies with side by side structure, as shown in FIG. 12.

Figure 13:
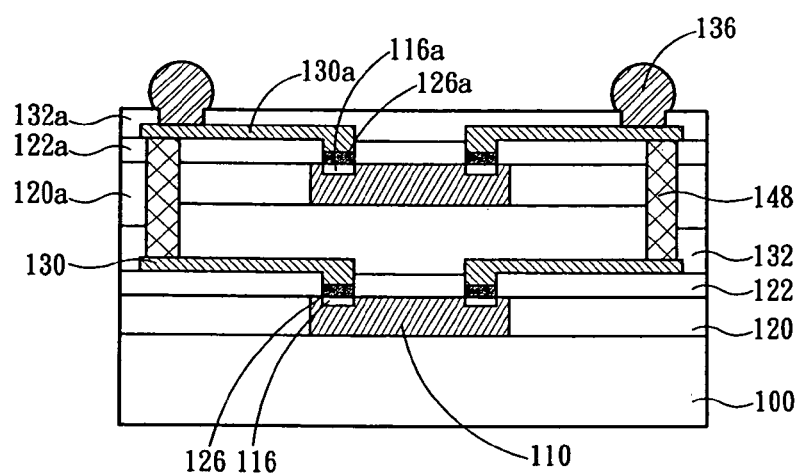
FIG. 13 is a schematic diagram of one packaged stacking structure having two dies according to the present invention.

The package process of the present invention even can apply to form multi dies with stacking structure. Referring to FIG. 13, after the step of forming the isolation layer 132 or the second openings 134, die 110a is placed on the isolation layer 132 in the vertical direction of the dies 110. Then, the third material layer 120a, the fourth material layer 122a, the second contact conductive layer 126a are formed in sequence as aforementioned. Third openings are formed by etching the third material layer 120a, the fourth material layer 122a, and the first isolation layer 132. Then conductive material 148 is placed into the third openings and the conductive material 148 is coupled with the conductive lines 130. The conductive material 148 may be a solder. Next, similar to the above illustrations of FIG. 7 to FIG. 10, a second conductive lines 130a, a second isolation layer 132a, and solder balls 136 are formed in sequence. Similarly, the material of the third material layer 120a and the fourth material layer 122a can be UV curing type or heating curing type material; the preferable material of the second contact conductive layer 126a is Ti, Cu, or the combination thereof; the material of the second conductive lines 130a are preferably Cu, Ni, Au, or the combination thereof. Although FIG. 13 only shows a stacking package structure with two dies, it is obvious that a stacking package structure with more than two dies can be obtained as aforementioned.

Hence, according to the present invention, the aforementioned package structure can maintain an appropriate pitch between two adjacent solder balls of the package structure. Therefore, the present invention can avoid the problems of signal coupling and signal interface. Moreover, the present invention also employs a glass substrate for LCD and the size of the glass substrate is very larger, so the present invention can lower the cost of the package structure and raise the yield of the package structure. Moreover, the package size of the present invention can be easily adjusted to test equipment, package equipment, etc.

Although specific embodiments have been illustrated and described, it will be obvious to those skilled in the art that various modifications may be made without departing from what is intended to be limited solely by the appended claims.

Having described the invention, the following is claimed:

1. A fan out type package structure, comprising:
   an isolating base;
   a first die adhered to said isolating base;
   a first dielectric layer formed on said isolating base and filled in a space except said first die on said isolating base;
   a second dielectric layer formed on said first dielectric layer and said first die, and said second dielectric layer having first openings on first pads of said first die;
   a first contact conductive layer formed on said first openings to electrically coupling with said first pads, respectively;
   a first conductive lines formed on said second dielectric layer and corresponding said first contact conductive layer, and said first conductive lines being extended out from corresponding said first contact conductive layer to corresponding first end points, wherein said corresponding first end points are inside a surface of said second dielectric layer;
   a first isolation layer formed on said first conductive lines and said second dielectric layer, and said first isolation layer having second openings on said first conductive lines;
   solder balls welded on said second openings and electrical coupling with said first conductive lines, respectively;

a second die adhered between said isolating base and said first dielectric layer in the vertical direction of said first die;

a third dielectric layer formed between said isolating base and said first dielectric layer;

a fourth dielectric layer formed among said first dielectric layer, said third dielectric layer, and said second die, and said second dielectric layer having third openings on second pads of said second die;

a second contact conductive layer formed on said third openings to electrically coupling with said second pads, respectively;

a second conductive lines formed among said first dielectric layer, said fourth dielectric layer, and corresponding said first contact conductive layer, and said second conductive lines extended out from corresponding said second contact conductive layer to corresponding second end points, wherein said corresponding second end points are inside a surface of said fourth dielectric layer;

a second isolation layer formed among said first conductive lines, said fourth dielectric layer, and said first dielectric layer;

fourth openings formed in said second isolation layer, said first dielectric layer, and said second dielectric layer on said second conductive lines; and conductive material filled in fourth openings and electrical coupling with said first conductive lines and said second conductive lines, respectively.

2. The package structure in claim 1, wherein surfaces of said third dielectric layer and said second die are at same level.

3. The package structure in claim 1, wherein materials of said third dielectric layer and said fourth dielectric material layer comprise UV curing type material, heat curing type material, and the combination thereof.

4. The package structure in claim 1, wherein said second contact conductive layer comprises Ti, Cu, and the combination thereof.

5. The package structure in claim 1, wherein said second conductive lines comprises Ni, Cu, Au, and the combination thereof.

6. The package structure in claim 1, further comprising at least one passive component on said isolating base.

* * * * *